(12) United States Patent
Masuda et al.

(10) Patent No.: US 8,870,592 B2
(45) Date of Patent: Oct. 28, 2014

(54) SOCKET AND DEVICE HAVING THE SOCKET

(75) Inventors: Yasushi Masuda, Kawasaki (JP); Akira Tamura, Kawasaki (JP); Satoshi Osawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/230,089

(22) Filed: Sep. 12, 2011

(65) Prior Publication Data

US 2012/0129361 A1 May 24, 2012

(30) Foreign Application Priority Data

Nov. 24, 2010 (JP) ................................. 2010-260918

(51) Int. Cl.
*H05K 1/00* (2006.01)
*H05K 7/10* (2006.01)
*H01R 12/70* (2011.01)
*H01R 12/91* (2011.01)

(52) U.S. Cl.
CPC .......... *H01R 12/7076* (2013.01); *H05K 7/1053* (2013.01); *H01R 12/91* (2013.01)
USPC ........................................................ 439/526

(58) Field of Classification Search
USPC ........ 439/591, 86, 91, 526, 71; 361/769, 767, 361/803, 820
See application file for complete search history.

(56) References Cited

U.S. PATENT DOCUMENTS

| 4,643,499 | A | | 2/1987 | Mitchell | |
|---|---|---|---|---|---|
| 5,073,116 | A | * | 12/1991 | Beck, Jr. ......................... | 439/71 |
| 5,073,117 | A | * | 12/1991 | Malhi et al. ..................... | 439/71 |
| 5,216,583 | A | | 6/1993 | Katsumata | |
| 5,268,814 | A | | 12/1993 | Yakubowski | |
| 5,653,600 | A | * | 8/1997 | Ollivier ........................... | 439/73 |
| 5,841,640 | A | * | 11/1998 | Shibata ......................... | 361/820 |
| 5,895,970 | A | * | 4/1999 | Miyoshi ........................ | 257/696 |
| 5,926,371 | A | * | 7/1999 | Dolbear ........................ | 361/704 |
| 6,088,915 | A | * | 7/2000 | Turturro ......................... | 29/840 |
| 6,561,818 | B1 | * | 5/2003 | Howell et al. .................. | 439/66 |
| 6,600,661 | B1 | | 7/2003 | Deeney | |
| 6,614,108 | B1 | * | 9/2003 | Sanftleben et al. ........... | 257/710 |
| 6,821,163 | B2 | * | 11/2004 | McHugh et al. ........... | 439/733.1 |

(Continued)

FOREIGN PATENT DOCUMENTS

| CN | 201355737 Y | 12/2009 |
|---|---|---|
| JP | 2000-133397 | 5/2000 |

(Continued)

OTHER PUBLICATIONS

European Search Report application No. 11181575.9 dated Feb. 2, 2012.

(Continued)

*Primary Examiner* — Neil Abrams
*Assistant Examiner* — Travis Chambers
(74) *Attorney, Agent, or Firm* — Squire Patton Boggs (US) LLP (57) ABSTRACT

A socket for providing an electric connection between a package and an electronic circuit board, the socket includes a package mounting area in which the package is mounted and an isotropic elastic body provided on the package mounting area and having a continuous shape along four side walls of the package so as to press the four side walls of the package.

10 Claims, 8 Drawing Sheets

(56) References Cited

U.S. PATENT DOCUMENTS

| | | | |
|---|---|---|---|
| 6,872,592 B2 * | 3/2005 | D'Amato et al. | 438/106 |
| 7,118,385 B1 * | 10/2006 | Bodenweber et al. | 439/71 |
| 7,435,102 B2 * | 10/2008 | Goodman | 439/70 |
| 7,573,718 B2 * | 8/2009 | Uzuka et al. | 361/742 |
| 8,221,135 B2 * | 7/2012 | Chang | 439/71 |
| 2005/0167153 A1 | 8/2005 | Uzuka et al. | |
| 2006/0012651 A1 * | 1/2006 | Lee et al. | 347/86 |
| 2007/0082515 A1 | 4/2007 | Goodman | |

FOREIGN PATENT DOCUMENTS

| | | |
|---|---|---|
| JP | 2003-007959 A | 1/2003 |
| JP | 2003-069187 A | 3/2003 |
| JP | 2004-014470 | 1/2004 |

OTHER PUBLICATIONS

Chinese Office Action, with English language translation, dated Dec. 18, 2013, for corresponding Chinese Application No. 201110310035.1.

Notification of Reasons for Refusal dated Jun. 3, 2014 corresponding to Japanese Patent Application No. 2010-260918 and English translation thereof.

Taiwanese Office Action dated Jun. 25, 2014 corresponding to Taiwan (R.O.C.) Patent Application No. 100133933 and English translation thereof.

* cited by examiner

SOCKET AND DEVICE HAVING THE SOCKET

CROSS-REFERENCE TO RELATED APPLICATION

This application is based upon and claims the benefit of priority of the prior Japanese Patent Application No. 2010-260918, filed on Nov. 24, 2010, the entire contents of which are incorporated herein by reference.

FIELD

The embodiments discussed herein are related to a socket for providing an electric connection between a package and an electronic circuit board and a device having the socket.

BACKGROUND

Land grid array (LGA) sockets are known for receiving a package which contains electronic components such as a CPU (central processing unit) and chipset so as to electrically connect the package to an electronic circuit board such as a system board.

An LGA socket is provided with backside conductive terminals (backside contacts) which are arranged on the back side of the socket board and configured such that the backside contacts are disposed on the conductive pads of the printed circuit board. The LGA socket is further provided with front side conductive terminals (front side contacts) arranged on the front side of the socket board so as to be connected to the respective backside contacts. The front side contacts are configured to be connected to the conductive pads of the package mounted thereon. Accordingly, the package and the printed circuit board are electrically connected via the LGA socket.

In recent years, a multi-core technology has been used, in which a plurality of processor cores are included in a single package. The multi-core technology increases the processing capability of the entire processor, thereby ensuring improved performance. However, as the number of processor cores increases, the number of terminals increases and the package tends to become larger.

Consequently, as the package increases in size, the manufacturing tolerance becomes larger and thus the positional tolerance with respect to the socket becomes larger. This causes a problem in that the alignment (centering) between the package and the socket becomes difficult. Japanese Laid-open Patent Publication Nos. 2000-133397 and 2004-14470 are examples of related art.

SUMMARY

According to an aspect of the embodiment, a socket for providing an electric connection between a package and an electronic circuit board, the socket includes a package mounting area in which the package is mounted and an isotropic elastic body provided on the package mounting area and having a continuous shape along four side walls of the package so as to press the four side walls of the package.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
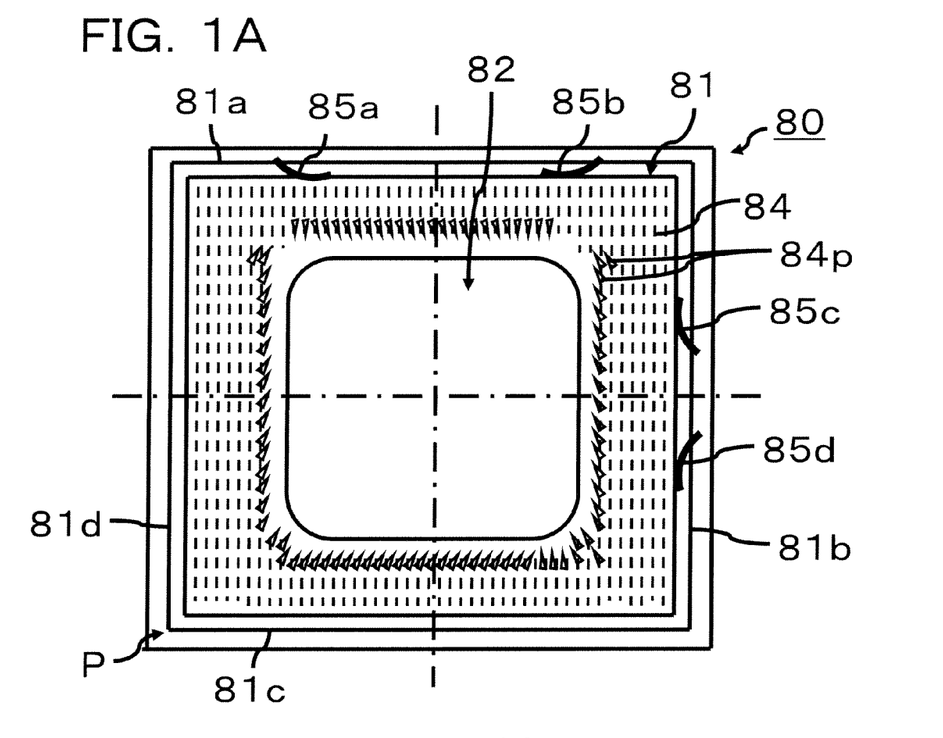
FIG. 1A is a plan view that illustrates a configuration of a socket of a comparative example.
Figure 1B:
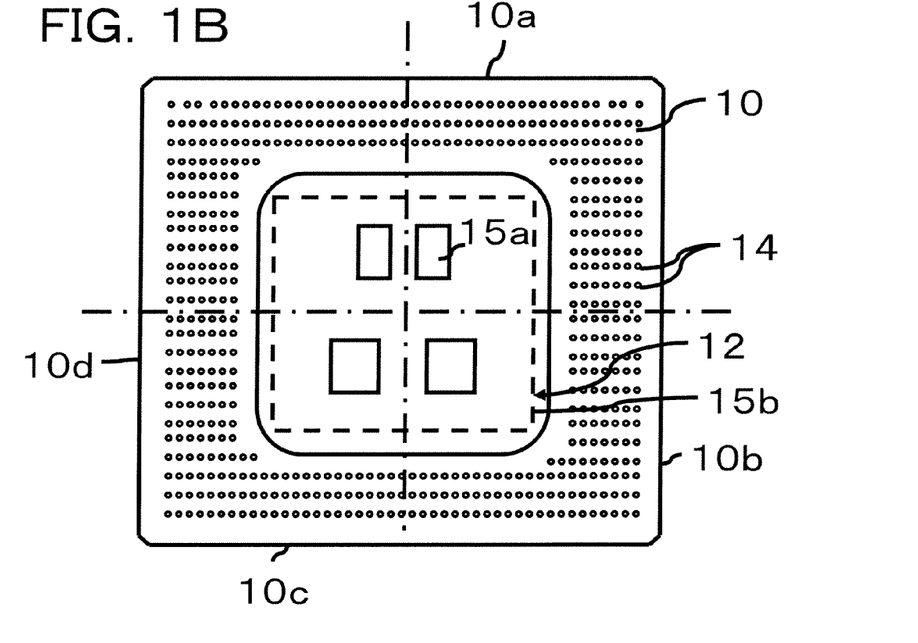
FIG. 1B is a plan view that illustrates a configuration of a package of a comparative example.

Embodiments of the invention will be described in detail below with reference to the attached drawings. FIGS. 1A and 1B are plan views that illustrate a configuration of a socket and a configuration of a package of a comparative example, respectively.

As illustrated in FIG. 1A, a socket 80 includes a package mounting area 81 which is surrounded by four side walls 81a to 81d. A socket board 84 having an opening 82 is placed on the package mounting area 81. The socket board 84 is provided with a number of front side conductive terminals 84p (only some of the terminals are illustrated for clarity). The front side conductive terminals (front side contacts) 84p are arranged so as to oppose the respective conductive pads 14 of the package 10.

As illustrated in FIG. 1B, the package 10 includes an electronic component mounting area 12. A plurality of electronic components 15a are arranged on the back side of the electronic component mounting area 12 (the front side of the drawing), while a CPU 15b is arranged on the front side of the electronic component mounting area 12 (the back side of the drawing). When the package 10 is mounted on the socket 80, the back side of the electronic component mounting area 12 (the front side of the drawing) opposes the opening 82 of the package 80 such that the plurality of electronic components 15a are housed in the opening 82.

Further, as illustrated in FIG. 1A, pressing springs 85a to 85d made of a resin, metal plate or the like are arranged on the side walls 81a and 81b of the package mounting area 81 which extend in two directions perpendicular to each other. One end of the respective pressing springs 85a to 85d is embedded in the side walls 81a and 81b. Then, when the package 10 is mounted on the socket 80, the pressing springs 85a and 85b press the side wall 10a of the package 10 in a direction toward the side wall 81c, while the pressing springs 85c and 85d press the side wall 10b of the package 10 in a direction toward the side wall 81d.

Accordingly, the package 10 is aligned (centered) with respect to the socket 80 with a force applied toward the intersection (corner) P between a line along the side wall 81c and a line along the side wall 81d. In this configuration, however, the pressing springs 85a to 85d exert a force only on a portion of the side walls of the package 10 and cannot exert a uniform force across the entire surface of the side walls 10a to 10d of the package 10.

To cope with the problem, it may be possible to provide the pressing springs on each of the four side walls 81a to 81d. However, as the tolerance has become larger due to the tendency of such packages to be of increased size as described above, it has become difficult to calculate each of the elastic forces of the pressing springs.

Moreover, the package is made of a ceramic or the like and can be fabricated only with a center alignment, since the geometrical accuracy in machining of the package is poor. On the other hand, the socket is designed with an end face alignment. Accordingly, it is difficult to align the outline of the package and the end face of the socket when the tolerance is large. As a result, the package 10 may not be centered or may rotate, which leads to misalignment.

The following describes how to align (center) the package with respect to the socket by applying a uniform force across the entire surface of the side walls 10a to 10d of the package 10 with reference to FIGS. 2A to 8.

Figure 2A:
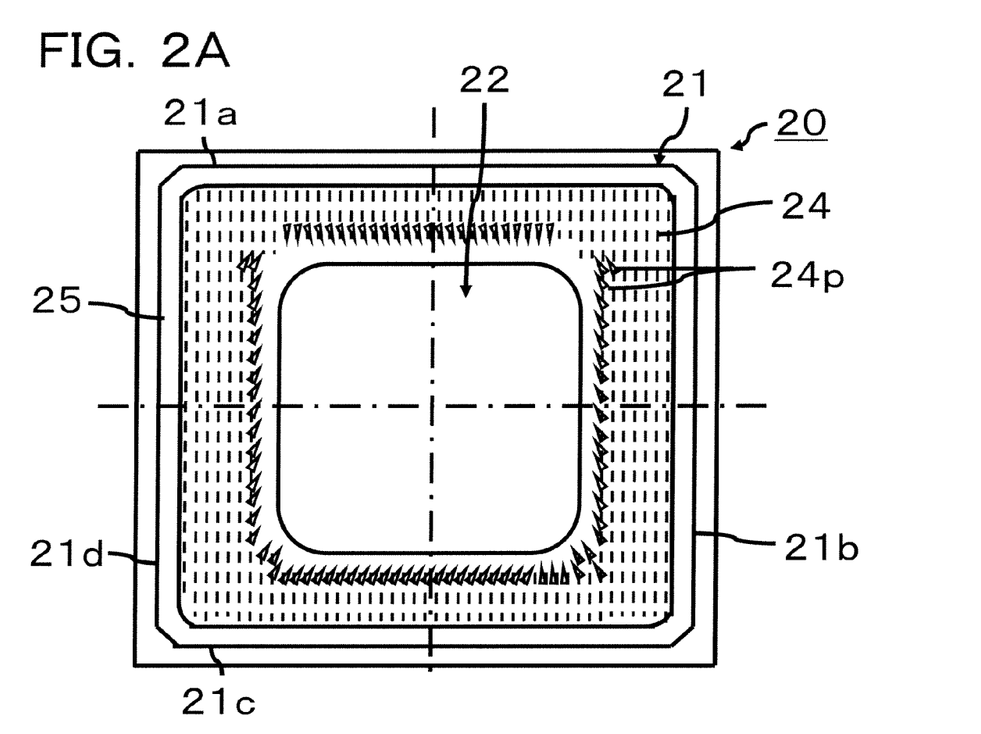
FIG. 2A is a view for illustrating a configuration of a socket according to a first embodiment.
Figure 2B:
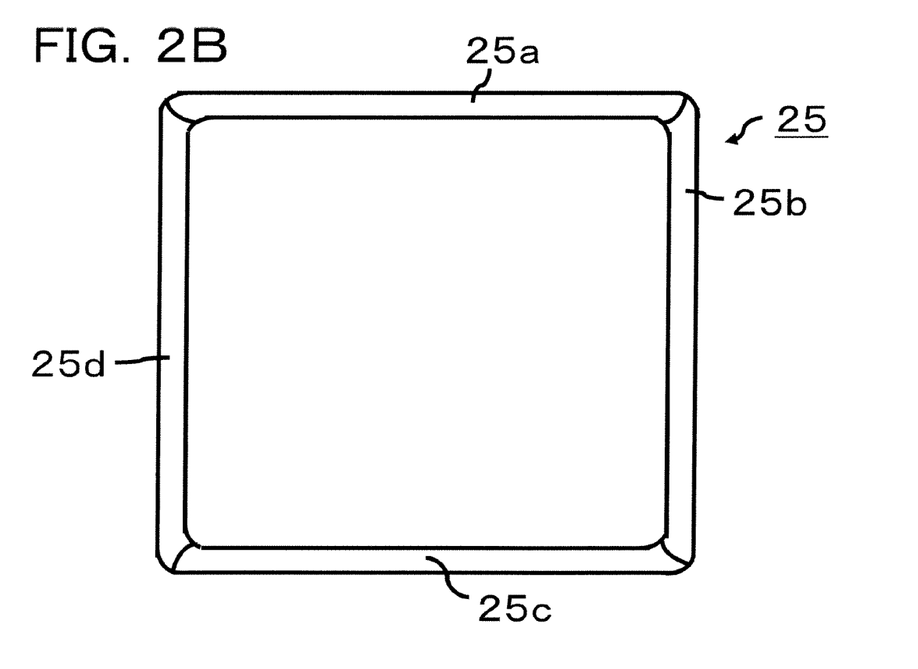
FIG. 2B is a view for illustrating a configuration of an isotropic elastic body according to the first embodiment.

FIGS. 2A and 2B are views for explaining a configuration of a socket and an isotropic elastic body, respectively, according to a first embodiment. In the description below, the package will be explained by using the package 10 illustrated in FIG. 2B.

As illustrated in FIG. 2A, a socket 20 includes a package mounting area 21 which is surrounded by four side walls 21a to 21d. A socket board 24 having an opening 22 is placed on the package mounting area 21. The socket board 24 is provided with a number of front side conductive terminals (front side contacts) 24p, only some of which are illustrated for clarity. The front side contacts 24p are arranged so as to oppose the respective conductive pads 14 of the package 10.

An isotropic elastic body 25 is provided on the package mounting area 21. The isotropic elastic body 25 is radially expanded using a fixture or the like when the package 10 is mounted in the package mounting area 21.

As illustrated in FIG. 2B, the isotropic elastic body 25 is formed in a frame shape having four continuous walls 25a to 25d which extend along the four side walls 10a to 10d of the package 10 and the four side walls 21a to 21d of the package mounting area 21. In addition, the isotropic elastic body 25 may be of any other form such as circular or polygonal ring as long as it has an opening at the center that elastically deforms for housing the package 10.

Further, the isotropic elastic body 25 is made of an isotropic elastic material which has a deformation response that does not vary depending on the direction of a load. An example of an isotropic elastic material is an isotropic elastic rubber such as a silicone rubber, isotropic elastic resin, or an isotropic elastic tube in which a gas or fluid such as a silicone oil is sealed. When using an isotropic elastic tube, the amount of sealant and the elastic modulus of the tube necessary for the desired elastic deformation should be considered in advance.

Figure 3:
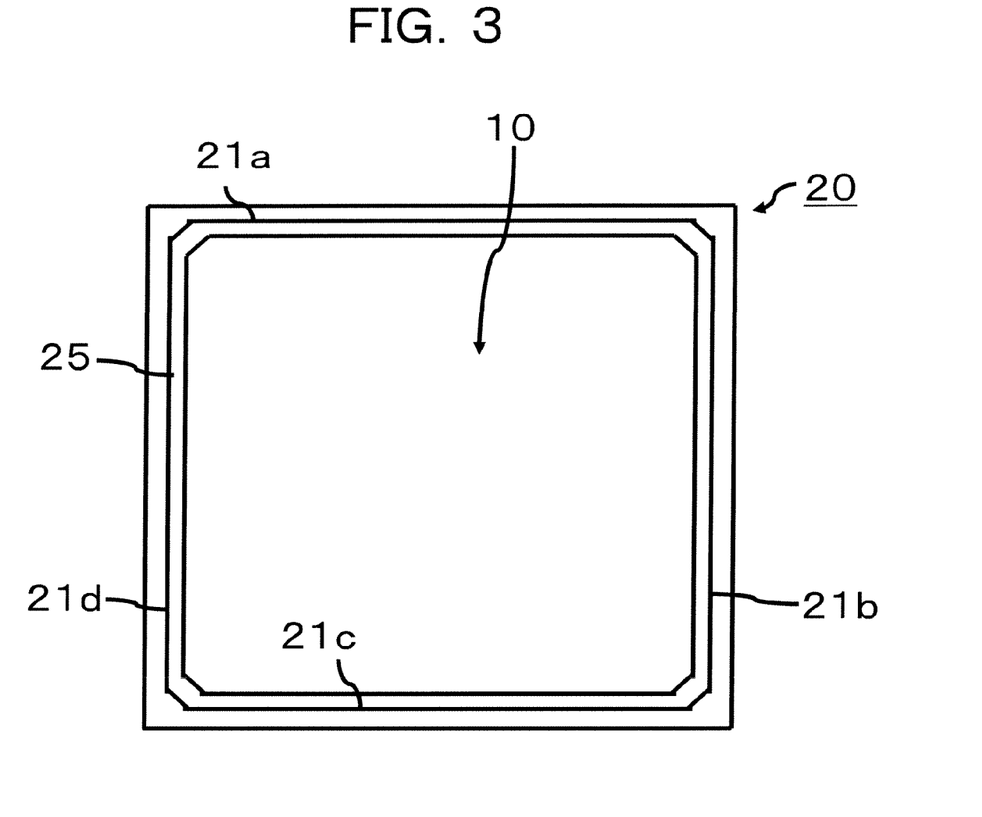
FIG. 3 illustrates that the package is mounted on the socket according to the first embodiment.

FIG. 3 is a view for explaining the package mounted on the socket according to the first embodiment. FIG. 3 illustrates that the package 10 is mounted on the socket and housed in the package mounting area 21.

The isotropic elastic body 25 is designed taking into consideration the balance between the thickness and the elastic deformation thereof so that the package 10, isotropic elastic body 25 and the side walls 21a to 21d are closely fitted when the package 10 is mounted. In addition, the isotropic elastic body 25 may be adhesively fixed to the package mounting area 21 without affecting the elastic deformation, or alternatively, may be fixedly held between and in close contact with the package mounting area 21 and the package 10.

Accordingly, the isotropic elastic body 25 can uniformly deform in all directions by a pressure applied when the package 10 is fitted in the package mounting area 21 or mounted on the electronic device as described later. Further, four sides 25a to 25d of the isotropic elastic body 25 can apply a uniform pressure across the entire surface of the side walls 10a to 10d of the package 10 which is mounted on the package mounting area 21.

Therefore, the isotropic elastic body 25 can apply a force to uniformly press the four sides of the package 10, thereby ensuring the alignment between the center of the package 10 and the center of the socket 20. As a result, reliable electrical connection between the front side contacts 24p of the socket 20 and the conductive pads 14 of the package 10 can be achieved regardless of the manufacturing tolerance or positional tolerance of the package 10 or the socket 20.

Figure 4:
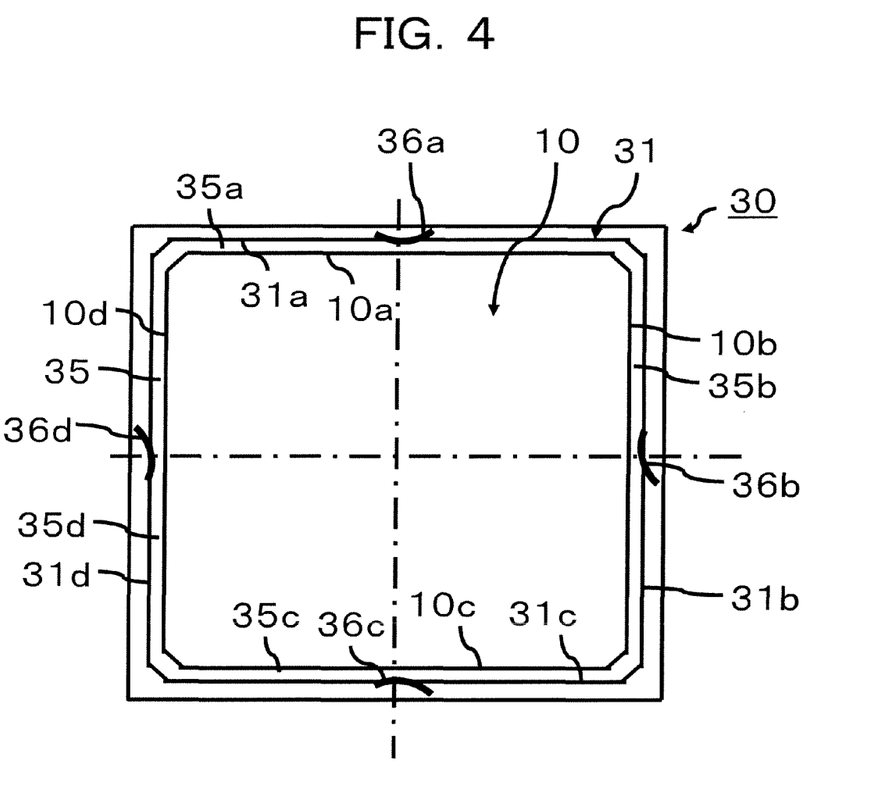
FIG. 4 illustrates that the package is mounted on a socket according to a second embodiment.

FIG. 4 is a view for explaining the package mounted on a socket according to a second embodiment. As illustrated in FIG. 4, a socket 30 includes a package mounting area 31 which is surrounded by four side walls 31a to 31d. Similarly to the first embodiment, a socket board having a plurality of front side contacts is placed on the package mounting area 31.

In this embodiment, an isotropic elastic body 35 can be the same as that described in the first embodiment. As illustrated in FIG. 4, the isotropic elastic body 35 is formed in a frame shape having four continuous walls 35a to 35d which extend along the four side walls 10a to 10d of the package 10 and the four side walls 31a to 31d of the package mounting area 31.

Further, also in this embodiment, the isotropic elastic body 35 may be made of an isotropic elastic rubber such as a silicone rubber, isotropic elastic resin, or an isotropic elastic tube in which a gas or fluid such as a silicone oil is sealed. The four side walls 10a to 10d do not have a smooth surface since the package 10 is made of a ceramic or the like. The use of the isotropic elastic tube for the isotropic elastic body 35 allows for a closer fit along the side walls 10a to 10d.

Further, biasing members are provided on the side walls 31a to 31d so as to press the four sides 35a to 35d of the isotropic elastic body 35 against the respective side walls 31a to 31d. In this embodiment, although leaf springs 36a to 36d are used as an example of biasing member, other springs such as a coil spring may be used. The isotropic elastic body 25 is thus fixedly held while being pressed against the package 10 with a biasing force of the leaf springs 36a to 36d.

Accordingly, the use of the biasing member allows for a closer fit between the isotropic elastic body 35 and the socket 30 regardless of the manufacturing tolerance or positional tolerance of the package 10, the socket 30 or the isotropic elastic body 35. Moreover, the combined use of the isotropic elastic tube and the biasing member can further improve the fit between the isotropic elastic body 35 and the socket 30.

Therefore, the isotropic elastic body 35 can apply a force to uniformly press the four side walls 10a to 10d of the package 10, thereby ensuring the alignment between the center of the socket 30 and the center of the package 10. As a result, reliable electrical connection between the front side contacts of the socket 30 and the conductive pads 14 of the package 10 can be achieved. Further, the improved fit can prevent misalignment which may be caused by the package 10 rotating after being mounted.

Figure 5A:
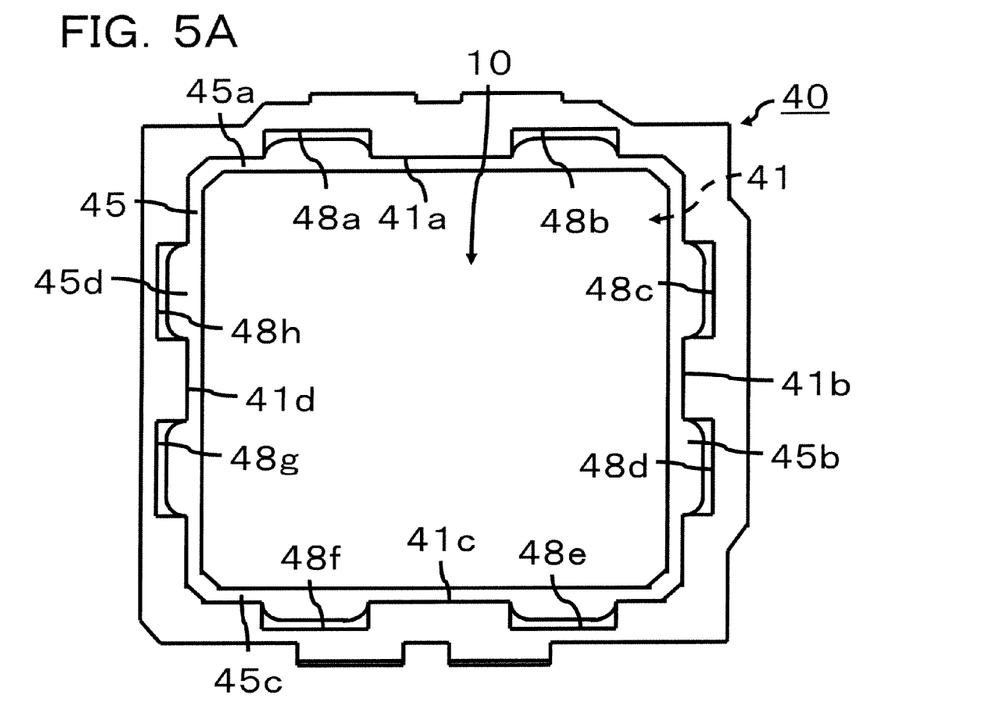
FIG. 5A illustrates that the package is mounted on a socket according to a third embodiment.
Figure 5B:
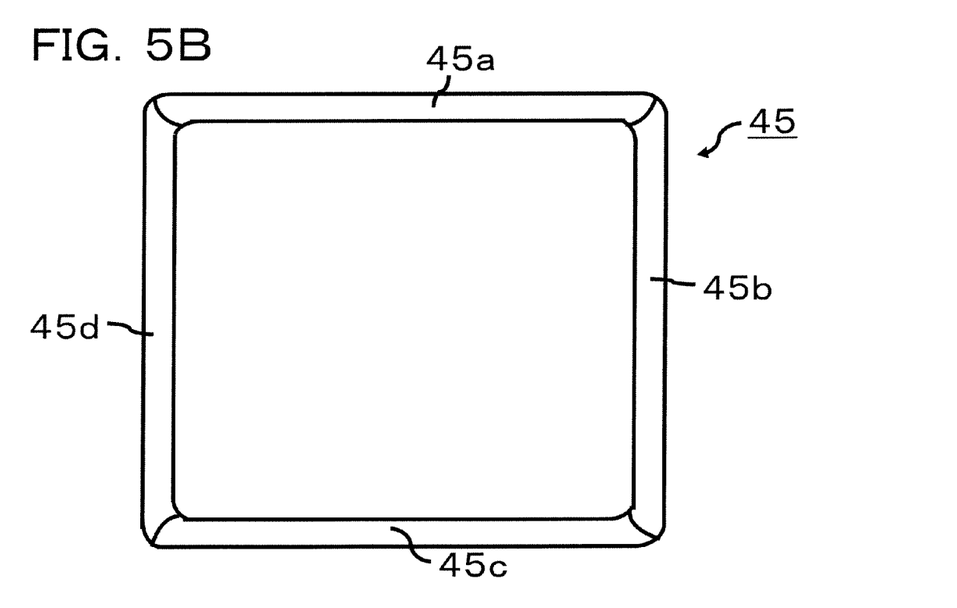
FIG. 5B illustrates a view for illustrating a configuration of an isotropic elastic body according to the third embodiment.

FIG. 5A is a view for explaining the package mounted on a socket and FIG. 5B is a view for explaining a configuration of an isotropic elastic body according to a third embodiment. As illustrated in FIG. 5, a socket 40 includes a package mounting area 41 which is surrounded by four side walls 41a to 41d. Similarly to the first embodiment, a socket board having a plurality of front side contacts is placed on the package mounting area 41.

A plurality of recesses 48a to 48h are formed on the side walls 41a to 41d. Each recess is formed as a clearance for receiving a part of the isotropic elastic body 45 which undergoes elastic deformation due to a force applied in order to facilitate the radial expansion of the isotropic elastic body 45 during mounting of the package 10. The size and shape of the recess can be modified as appropriate in accordance with the elastic force to be applied or the material selection for the isotropic elastic body 45.

Further, also in this embodiment, the isotropic elastic body 45 can be the same as that described in the first and second embodiments. As illustrated in FIG. 5B, the isotropic elastic body 45 is formed in a frame shape having four continuous walls 45a to 45d which extend along the four side walls 10a to 10d of the package 10 and the four side walls 41a to 41d of the package mounting area 41.

The isotropic elastic body 45 is designed to be longer than that of the first and second embodiment for allowing deformation of the isotropic elastic body 45 into the recesses 48a to 48h. Further, also in this embodiment, the isotropic elastic body 45 may be made of an isotropic elastic rubber such as a silicone rubber, isotropic elastic resin, or an isotropic elastic tube in which a gas or fluid such as a silicone oil is sealed.

The use of recesses 48a to 48h thus facilitates the radial expansion of the isotropic elastic body 45 using a fixture or the like so that the package 10 can be readily mounted.

Figure 6A:
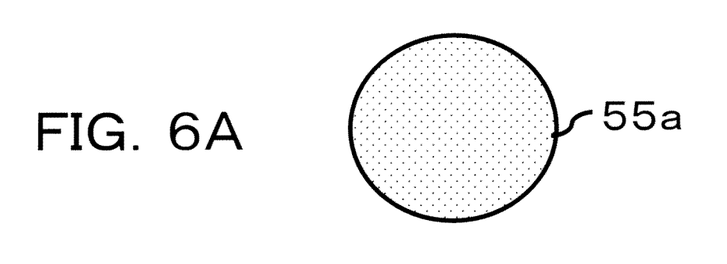
FIG. 6A illustrates a first example of a sectional view of an isotropic elastic body.
Figure 6B:
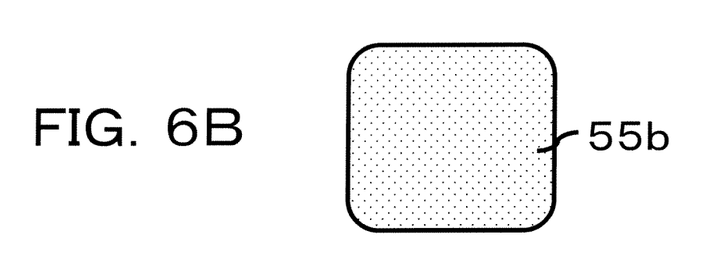
FIG. 6B illustrates a second example of a sectional view of an isotropic elastic body.
Figure 6C:
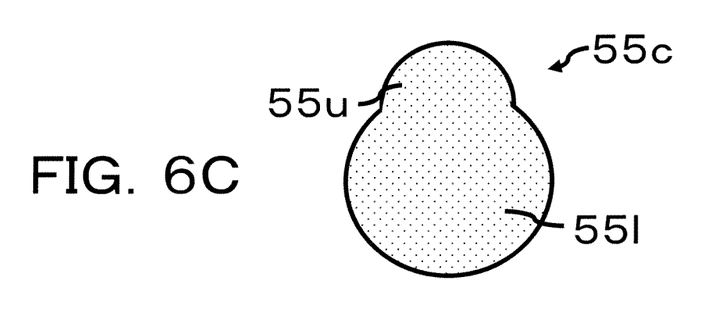
FIG. 6C illustrates a third example of a sectional view of an isotropic elastic body.

FIGS. 6A to 6C are sectional views of an isotropic elastic body. FIG. 6A illustrates an isotropic elastic body 55a having a round cross-sectional shape. For example, the isotropic elastic body 55a having a round cross-sectional shape facilitates a mounting of the package 10 and is readily deformed in accordance with the side walls of the package 10 and the side walls of the package mounting area. As a result, the package 10 can be pressed with good accuracy. The detail will be described below in FIG. 7.

The cross-sectional shape may be a polygonal shape. As an example illustrated in FIG. 6B, an isotropic elastic body 55b having a square cross-sectional shape can be used. The isotropic elastic body 55b having a square cross-sectional shape makes a surface contact with the side walls of the package mounting area and can be readily deformed in accordance with the side walls of the package 10, thereby ensuring pressing of the package with good accuracy. A hexagonal or octagonal cross section facilitates the mounting of the package 10 in the same manner as the round cross section and can be readily deformed in accordance with the side walls of the package 10 and the side walls of the package mounting area.

Moreover, when the isotropic elastic bodies 55a, 55b are used in the first and/or second embodiments, the isotropic elastic bodies 55a, 55b are formed in a frame shape having an inner diameter equal to or slightly smaller than the external dimensions of the package 10 and an outer diameter equal to or slightly smaller than the dimensions of the side walls of the package mounting area. Further, when the isotropic elastic bodies 55a, 55b are used in the third embodiment, the dimensions of the isotropic elastic bodies 55a, 55b are formed taking into consideration an allowance for deformation into the recesses 48a to 48h as described above.

Accordingly, a fit between the package 10 and the side walls of the package mounting area can be improved, thereby preventing misalignment which may be caused by the package 10 rotating after being mounted.

FIG. 6C illustrates an isotropic elastic body 55c having a pear-shaped cross section. When the socket is secured on an electronic circuit board by means of a pressure applying mechanism, a lower portion of the cross section 55l of the isotropic elastic body 55c is elastically deformed by a force applied to an upper portion of the cross section 55u of the isotropic elastic body 55c. In addition, each of the upper portion of the cross section 55u and the lower portion of the cross section 55l may be of a shape other than round as illustrated in the figure, but may be formed as a polygonal shape. With this configuration, the alignment (centering) between the socket and the package 10 can be achieved. The detail will be described below in FIG. 8.

Moreover, when the isotropic elastic body 55c is used in the first and/or second embodiments, the isotropic elastic body 55c is formed in a frame shape having an inner diameter (of the lower portion of the cross section 55l) equal to or slightly smaller than the external dimensions of the package 10 and an outer diameter (of the lower portion of the cross section 55l) equal to or slightly smaller than the dimensions of the side walls of the package mounting area. Further, when the isotropic elastic body 55c is used in the third embodiment, the dimensions of the isotropic elastic body 55c is formed taking into consideration an allowance for deformation into the recesses 48a to 48h as described above.

Accordingly, the elastic deformation of the lower portion of the cross section 55l of the isotropic elastic body 55c allows for an improved fit between the package 10 and the side walls of the package mounting area, thereby preventing misalignment which may be caused by the package 10 rotating after being mounted.

The cross-sectional shape of the isotropic elastic body is not limited to those described above and various shapes can be used in accordance with how to apply an elastic force. Further, each side of the isotropic elastic body is not necessarily formed with the same width and can be modified depending on the center position.

Figure 7:
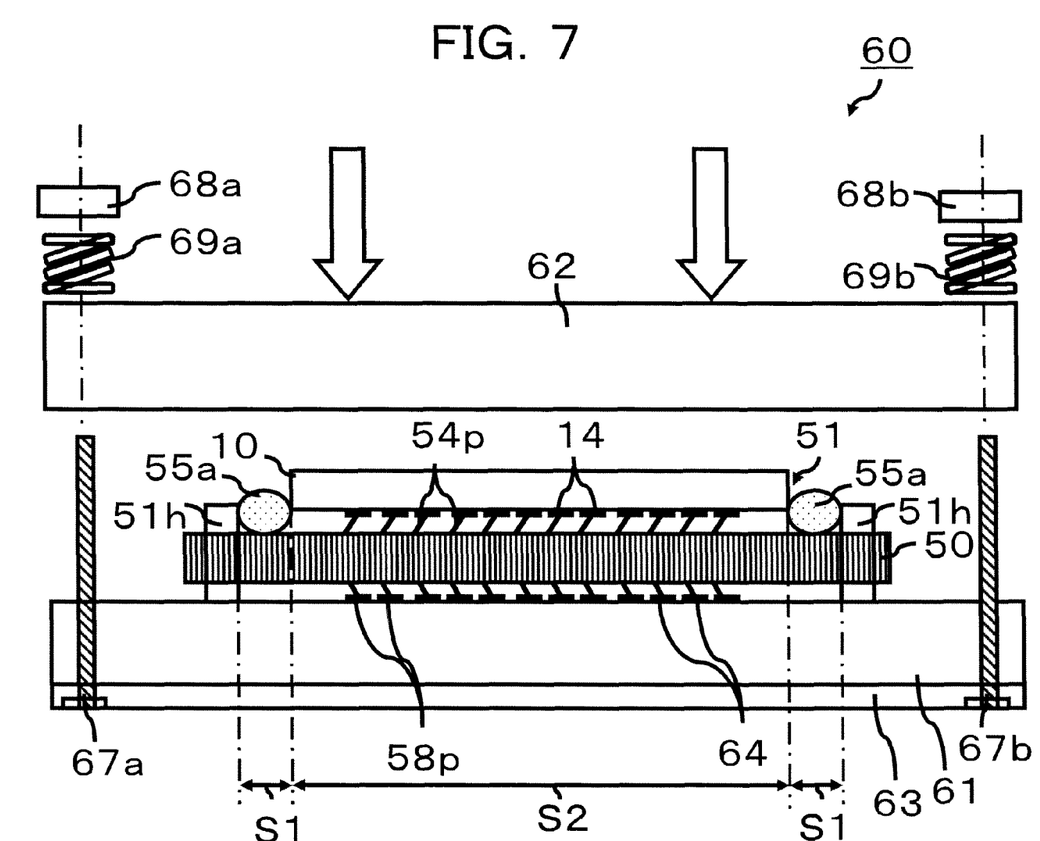
FIG. 7 illustrates a first example of the invention applied to an electronic device.

FIG. 7 illustrates a first example applied to an electronic device. As illustrated in FIG. 7, an electronic device 60 is a device such as an electronic circuit board, a computer having an electronic circuit board, or the like. The electronic device 60 at least includes a socket 50, the package 10 a system board 61 as an electronic circuit board, a pressure applying mechanism 62 and a back board 63. The pressure applying mechanism 62 is a cover, heat sink, or the like.

The socket 50 can be applied to the socket described in any of the first to third embodiments. Although an isotropic elastic body in FIG. 7 is described as the isotropic elastic body 55a having a round cross-sectional shape illustrated in FIG. 6A, the same description can be applied to the isotropic elastic body 55b having a polygonal cross-sectional shape illustrated in FIG. 6B, which is not further illustrated or described.

The isotropic elastic body 55a having a round cross-sectional shape is radially expanded using a fixture or the like. Then, the package 10 is fitted into a space at the center of the isotropic elastic body 55a such that the conductive pads 14 of the package 10 oppose the respective front side contacts 54p of the socket 50.

The socket 50 is removably or exchangeably attached on the system board 61. Then, a plurality of conductive pads 64 of the system board 61 and backside contacts 58p of the socket 50 are aligned.

The back board 63 is disposed on the side of the system board 61 opposite to the side on which the package is mounted. The back board 63 is for preventing warpage of the system board 61. A plurality of bolts 67a and 67b are press fitted into the system board 61 and inserted into holes of the system board 61 and the pressure applying mechanism 62, which are not illustrated.

Then, the pressure applying mechanism 62 is positioned above the front surface of the package 10 and nuts 68a and 68b are screwed onto the plurality of bolts 67a and 67b with coil springs 69a and 69b. Accordingly, the system board 61, the package 10 and the socket 50 placed between the pressure applying mechanism 62 and the back board 63 are compressed by a force applied from the upper position by means of the pressure applying mechanism 62.

When the pressure applying mechanism 62 applies a pressure, the isotropic elastic body 55a is pressed against side walls 51h of the package mounting area 51 and undergoes elastic deformation in accordance with the side walls of the package 10 and the side walls 51h of the package mounting area. As a result, a width S2 of the package 10 does not change due to the rigidity, while a width S1 of each side of the isotropic elastic body 55a changes uniformly.

Therefore, the isotropic elastic body 55a can closely fit to the package 10 so as to uniformly press the four sides of the package 10, thereby ensuring the alignment (centering) between the package 10 and the package mounting area 51 by means of a stress during fitting of the package 10 into the package 10 and a pressure applied by the pressure applying mechanism 62.

Moreover, when the pressure applying mechanism 62 applies a pressure, the front side contacts 54p having resilience are pressed against and in contact with the plurality of conductive pads 14 so as to establish electric continuity. Similarly, the backside contacts 58p having resilience are pressed against and in contact with the plurality of conductive pads 64 so as to establish electric continuity. Accordingly, the socket 50 allows for reliable electric connection between the package 10 and the system board 61.

Figure 8:
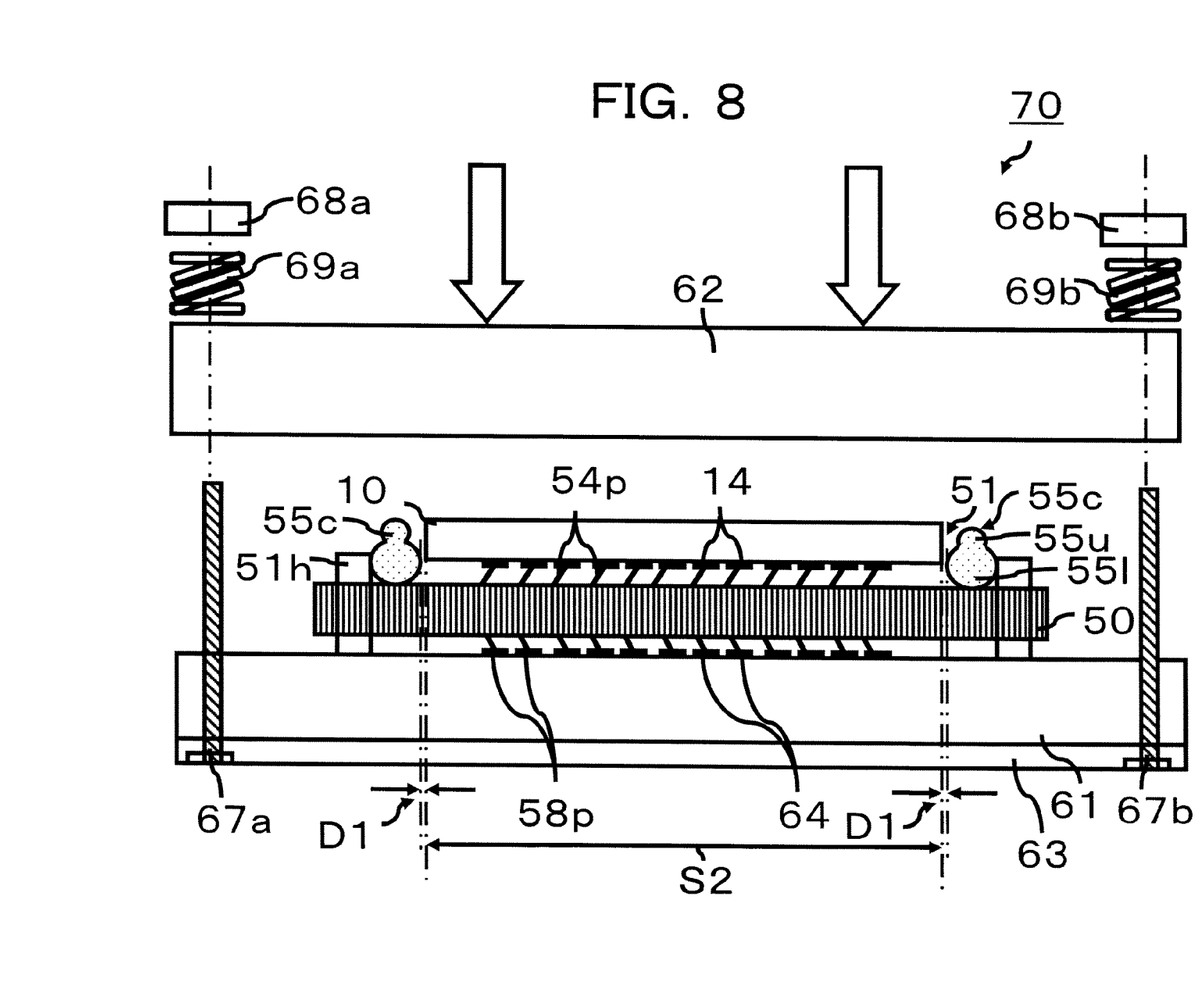
FIG. 8 illustrates a second example of the invention applied to an electronic device.

FIG. 8 illustrates a second example applied to an electronic device. An electronic device 70 illustrated in FIG. 8 differs from the electronic device 60 illustrated in FIG. 7 only in that an isotropic elastic body is described as the isotropic elastic body 55c having a pear-shaped cross section illustrated in FIG. 6C, and other configurations are the same as those illustrated in FIG. 7.

As illustrated in FIG. 8, a gap D1 is provided between the outer periphery of the isotropic elastic body 55c and the outer periphery of the package 10. The gap D1 is defined in advance in accordance with the elastic modulus of the isotropic elastic body 55c and the deformation to a stress.

Then, the package 10 is fitted into a space at the center of the isotropic elastic body 55c such that the conductive pads 14 of the package 10 oppose the respective front side contacts 54p of the socket 50. As a result, the package 10 can be fitted into the package mounting area 51 without radially expanding the isotropic elastic body 55c using a fixture or the like as illustrated in FIG. 7.

The socket 50 is removably or exchangeably attached on the system board 61. Then, a plurality of conductive pads 64 of the system board 61 and backside contacts 58p of the socket 50 are aligned.

The back board 63 is disposed on the side of the system board 61 opposite to the side on which the package is mounted. The back board 63 is for preventing warpage of the system board 61. A plurality of bolts 67a and 67b are press fitted into the system board 61 and inserted into holes of the system board 61 and the pressure applying mechanism 62, which are not illustrated.

Then, the pressure applying mechanism 62 is positioned above the front surface of the package 10 and the nuts 68a and 68b are screwed onto the plurality of bolts 67a and 67b with the coil springs 69a and 69b. Accordingly, the system board 61, the package 10 and the socket 50 placed between the pressure applying mechanism 62 and the back board 63 are compressed by a force applied from the upper position by means of the pressure applying mechanism 62.

When the pressure applying mechanism 62 applies a pressure, the upper portion of the cross section 55u of the isotropic elastic body 55c is uniformly pressed, which causes the lower portion of the cross section 55l to be deformed and expanded. Consequently, the lower portion of the cross section 55l undergoes elastic deformation in accordance with the side walls of the package 10 and the side walls 51h of the package mounting area, thereby eliminating the gap D1. As a result, the lower portion of the cross section 55l of the isotropic elastic body 55c can closely fit to the package 10 so as to uniformly press the four sides of the package 10.

That is, although the width S2 of the package 10 does not change due to the rigidity, the width of each side of the lower portion of the cross section 55l of the isotropic elastic body 55c changes uniformly, thereby ensuring a close fit between the package 10 and the isotropic elastic body 55c. Therefore, the package 10 can be aligned (centered) with the package mounting area 51 by means of a pressure from the pressure applying mechanism 62.

Moreover, when the pressure applying mechanism 62 applies a pressure, the front side contacts 54p having resilience are pressed against and in contact with the plurality of conductive pads 14 so as to establish electric continuity. Similarly, the backside contacts 58p having resilience are pressed against and in contact with the plurality of conductive pads 64 so as to establish electric continuity.

Accordingly, the socket 50 allows for reliable electric connection between the package 10 and the system board 61.

The socket and the electronic device according to the invention can uniformly press the four sides of the package by means of an isotropic elastic body. Therefore, the package can be aligned with the socket regardless of a tolerance of the package, thereby ensuring reliable electrical connection between the package and the socket.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A socket for providing an electric connection between a package and an electronic circuit board, the socket comprising:
   a package mounting area in which the package is mounted;
   an isotropic elastic body provided on the package mounting area and having a continuous shape along four side walls of the package so as to press the four side walls of the package, wherein the socket provides an electrical connection between the package and the electronic circuit board; and a plurality of biasing members provided on the four side walls of the package mounting area so as to press the four sides of the isotropic elastic body.

2. A socket according to claim 1, wherein the package mounting area has at least one recess formed in each side wall.

3. A socket according to claim 1, wherein the isotropic elastic body has a round, polygonal or pear-shaped cross section.

4. A socket according to claim 1, wherein the isotropic elastic body is made of an isotropic elastic rubber or isotropic elastic resin.

5. A socket according to claim 1, wherein the isotropic elastic body is a tube in which a fluid or gas is sealed.

6. An electronic device comprising:
an electronic circuit board;
a package; and
a socket for providing an electric connection between a package and an electronic circuit board,
wherein the socket comprising:
a package mounting area in which the package is mounted;
an isotropic elastic body provided on the package mounting area and having a continuous shape along four side walls of the package so as to press the four side walls of the package; and
a plurality of biasing members provided on the four side walls of the package mounting area so as to press the four sides of the isotropic elastic body.

7. An electronic device according to claim 6, wherein the package mounting area has at least one recess formed in each side wall.

8. An electronic device according to claim 6, wherein the isotropic elastic body has a round, polygonal or pear-shaped cross section.

9. An electronic device according to claim 6, wherein the isotropic elastic body is made of an isotropic elastic rubber or isotropic elastic resin.

10. An electronic device according to claim 6, wherein the isotropic elastic body is a tube in which a fluid or gas is sealed.

* * * * *